United States Patent
Farnworth et al.

(10) Patent No.: US 7,232,747 B2
(45) Date of Patent: Jun. 19, 2007

(54) METHOD OF WAFER BUMPING FOR ENABLING A STITCH WIRE BOND IN THE ABSENCE OF DISCRETE BUMP FORMATION

(75) Inventors: Warren M. Farnworth, Nampa, ID (US); Jerry M. Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/928,512

(22) Filed: Aug. 26, 2004

(65) Prior Publication Data

US 2005/0032348 A1   Feb. 10, 2005

Related U.S. Application Data

(62) Division of application No. 10/413,977, filed on Apr. 15, 2003, which is a division of application No. 10/225,978, filed on Aug. 22, 2002.

(51) Int. Cl.
*H01L 21/44* (2006.01)
(52) U.S. Cl. .................. 438/612; 438/614; 438/617; 257/E21.174
(58) Field of Classification Search ........ 438/613–614, 438/617, 678, 686
See application file for complete search history.

(56) References Cited

U.S. PATENT DOCUMENTS

| | | | |
|---|---|---|---|
| 4,495,222 A | 1/1985 | Anderson et al. | |
| 4,908,685 A | 3/1990 | Shibasaki et al. | |
| 5,187,121 A | 2/1993 | Cote et al. | |
| 5,328,079 A | 7/1994 | Mathew et al. | |
| 5,352,927 A | 10/1994 | Cote et al. | |
| 5,437,405 A | 8/1995 | Asanasavest | |
| 5,492,863 A | 2/1996 | Higgins, III | |
| 5,587,338 A | 12/1996 | Tseng | |
| 5,689,140 A | 11/1997 | Shoda | |
| 5,892,273 A | 4/1999 | Iwasaki et al. | |
| 6,028,011 A * | 2/2000 | Takase et al. ............... | 438/745 |
| 6,103,612 A | 8/2000 | Howard et al. | |
| 6,147,413 A | 11/2000 | Farnworth | |
| 6,214,642 B1 | 4/2001 | Chen et al. | |
| 6,300,236 B1 | 10/2001 | Harper et al. | |

(Continued)

OTHER PUBLICATIONS

Harman, George, G., "Wire Bonding in Microelectronics: Materials, Processes, Reliability, and Yield," Second Edition, 1997, pp. 263-280.

(Continued)

*Primary Examiner*—Michael Lebentritt
*Assistant Examiner*—Kyoung Lee
(74) *Attorney, Agent, or Firm*—TraskBritt

(57) ABSTRACT

A method of bumping a wafer for facilitating bonding of bond wires to elevate the bond location above the passivation layer. The wafer is bumped by disposing the wafer in at least one electroless bath having a nickel-containing solution therein, wherein bumps having a nickel-containing material are formed simultaneously on the exposed bond pads to an elevation sufficient to prevent damage to a passivation layer surrounding the bond pads by contact of a wire bonding capillary. A gold or palladium cap may optionally be formed over the nickel-containing material of the bumps. A method of forming a semiconductor device assembly is also disclosed.

16 Claims, 5 Drawing Sheets

U.S. PATENT DOCUMENTS

| | | |
|---|---|---|
| 6,362,090 B1 | 3/2002 | Paik et al. |
| 6,404,615 B1 * | 6/2002 | Wijeyesekera et al. .. 361/306.1 |
| 6,435,398 B2 * | 8/2002 | Hartfield et al. ............ 228/103 |
| 6,445,069 B1 | 9/2002 | Ling et al. |
| 6,479,900 B1 | 11/2002 | Shinogi |
| 6,525,412 B2 | 2/2003 | Noshita |
| 6,534,863 B2 | 3/2003 | Walker et al. |
| 6,650,013 B2 | 11/2003 | Yin et al. |
| 2001/0017412 A1 | 8/2001 | Asazu et al. |
| 2002/0001670 A1 * | 1/2002 | Pauw et al. ................... 427/98 |
| 2003/0042621 A1 | 3/2003 | Chen et al. |
| 2003/0116845 A1 * | 6/2003 | Bojkov et al. .............. 257/738 |
| 2004/0082102 A1 | 4/2004 | Sasaki |

OTHER PUBLICATIONS

Material from 10$^{th}$ Annual International KGD Packaging and Test Workshop, Sep. 8-10, 2003 NAPA, California.

* cited by examiner

METHOD OF WAFER BUMPING FOR ENABLING A STITCH WIRE BOND IN THE ABSENCE OF DISCRETE BUMP FORMATION

CROSS-REFERENCE TO RELATED APPLICATIONS

This application is a divisional of application Ser. No. 10/413,977, filed Apr. 15, 2003, pending, which is a divisional of application Ser. No. 10/225,978, filed Aug. 22, 2002, pending.

BACKGROUND OF THE INVENTION

1. Field of the Invention

The present invention relates generally to methods and apparatus for bumping a wafer. In particular, the present invention relates to methods and apparatus of bumping a wafer and stitch wire bonding to the bumps as well as resulting assemblies and systems.

2. State of the Art

Chip-On-Board ("COB") or Board-On-Chip ("BOC") technology is well known and utilized for mechanically attaching and electrically connecting semiconductor dice directly to a carrier substrate such as a printed circuit board ("PCB"). Electrical connection in COB and BOC assemblies may be effected using various techniques such as wire bonding, tape automated bonding, and flip-chip attachment. Similarly, semiconductor dice may be attached and electrically connected to a carrier substrate in the form of a lead frame, such as a conventional die paddle lead frame and a leads-over-chip (LOC) lead frame.

Wire bonding is generally preceded by attachment of a semiconductor die to a carrier substrate with an appropriate adhesive, such as an epoxy, silver solder or adhesive-coated film or tape segment. A plurality of fine wires is then attached individually to each bond pad on the semiconductor die and extended and bonded to a corresponding terminal pad (or lead) of the carrier substrate. The assembly or at least a portion of the semiconductor die then may be encapsulated with a filled polymer by transfer molding, injection molding, pot molding, or with a mass of silicone or an epoxy in a so-called "glob top" encapsulation process.

There are several predominant types of wire bonding techniques, including aluminum wedge ultrasonic bonding and gold thermosonic or thermocompression stitch bonding. Although the gold thermosonic or thermocompression stitch bonding technique has an associated higher cost in materials than the aluminum wedge bonding technique, the gold thermosonic bond is faster to form. For example, gold thermosonic bonders are capable of production speeds of ten wires/second compared to speeds of aluminum wedge bonders of five wires/second.

As the sizes and pitches (spacing) of semiconductor die bond pads have continued to decrease in concert with ongoing miniaturization of integrated circuits, reduction of bond pad sizes has precluded the use of wirebonder capillaries to form stitch or wedge bonds on the bond pads due to damaging contact of the capillary with the relatively fragile and nonresilient (typically a glass) passivation layer surrounding the bond pads on the active surface. While a tilted orientation of wirebonder capillary end surface to prevent passivation layer damage has been proposed in U.S. Pat. No. 5,437,405 to Asanavest, this is not an ideal solution and the approach is still limited by ever-decreasing bond pad size. Accordingly, it has been proposed to form a ball bump or stud bump of conductive material on a bond pad preliminary to actual wire bonding, and then to form a protruding stitch bond to the previously formed ball or stud bump at a safe elevation above the surface of the passivation layer. U.S. Pat. No. 5,328,079 to Mathew et al. discloses forming a conductive bump with a wirebonder capillary to a bond pad of a semiconductor die and then subsequently stitch bonding to the bump to protect the surrounding area of the passivation layer surface. However, individually forming conductive bumps on the bond pads on a wafer to facilitate subsequent wire bonding thereto has proven to be neither cost effective nor time efficient.

Gold has been favored as a metal for stud bumping bond pads to which gold wires are to be stitch bonded. Specifically, bumping semiconductor die bond pads with a stud bump, typically gold, is conventionally used to provide a preferred contact for gold thermosonic or thermocompression bonding, as a gold stud bump provides an excellent contact for the gold wire, being easily bondable and providing a robust connection. Further, a gold stud bump formed on a bond pad results in a conductive structure displaced above the relatively fragile passivation layer surface of the die or wafer surrounding and at a substantially higher elevation over the active surface than the bond pads and provides a bonding surface for contact by a wire bonding capillary without the risk of contacting and damaging the surrounding passivation layer surface.

Gold stud bumps are formed with a thermosonic or thermocompression capillary, wherein the wirebonder capillary forms and releases a gold ball on each separate bond pad, individually and consecutively, until each bond pad on a wafer receives a gold stud bump. Some wafers conventionally include as many as about 11,400 bond pads and the 300 mm wafers now being implemented by the semiconductor industry will greatly increase this number. The instruments and capillary utilized for forming the gold bumps have optimum stud bumping speeds of about eight to ten balls/second. Thus, it would take approximately one hour to gold stud bump 2½ to slightly over 3 wafers having 11,400 bond pads each, depending on bumping speed. Since a wirebonder may have a capital cost in excess of one hundred thousand dollars, and acceptable bumped wafer throughput thus requires a large number of wirebonders in addition to the process time involved, it will be appreciated that the current approach to wafer bumping is less than optimum.

Therefore, it would be advantageous to form bumps on a wafer to enable the advantages of gold thermosonic or thermocompression bonding, but with greater throughput. It would also be advantageous to produce bumps on a wafer to enable stitch bonding without the excessive material costs of gold stud bumps.

BRIEF SUMMARY OF THE INVENTION

The present invention relates to methods and apparatus for bumping wafers. The present invention is directed to providing a semiconductor die to be singulated from a bumped wafer to which bond wires may be stitch bonded without requiring prior formation of a gold stud bump. The semiconductor die includes an active surface and a back surface, wherein the active surface includes bond pads thereon. The bond pads may be in locations of an original bond pad pattern, or may be rerouted over the active surface of the semiconductor die using conductive traces in the form of a so-called redistribution layer, or RDL. At least some, and typically all, of the bond pads on the active surface of the semiconductor die include a plated bump formed thereon. The plated bumps include a nickel material and are located to facilitate a stitch bond thereto. The terms "plated bump" or "bump" according to the present invention and as that term is used herein with reference to the present invention is not to be construed as requiring or including a ball or other protrusion, but rather encompasses a contact element having at least a portion of its outer surface extending substantially parallel to an active surface of the semiconductor die and the bond pad over which it is formed, such contact element exhibiting a substantially flat exposed surface. The contact element may further reside within the confines of a passivation layer surrounding the bond pads or, optionally, protrude over the passivation layer.

In accordance with the present invention, the plated bumps are formed on bond pads of unsingulated semiconductor dice at the wafer level. In particular, one or more wafers having the bond pads exposed through passivation layers on the active surfaces thereof are disposed in a bath of a nickel-containing solution to undergo an electroless plating process in the bath and simultaneously form nickel-containing plated bumps on each of the bond pads on the one or more wafers. The one or more wafers may then optionally be placed in another electroless bath of either a gold-containing solution or a palladium-containing solution to form either a gold-containing cap or a palladium-containing cap, respectively, on the previously formed nickel-containing plated bump. An immersion bath to plate a gold-containing cap of self-limiting thickness may also be employed in lieu of electroless plating. In any case, one would employ an immersion bath prior to initiation of the electroless plating to provide a basis for formation of the electrolessly deposited metal. The wafer having the plated bumps formed on each of the bond pads may then undergo a singulation process as known in the art to divide the wafer into individual semiconductor dice. In another process according to the present invention and in lieu of using the aforementioned electroless baths, the plated bumps may be formed using an electrolytic process.

In one aspect of the present invention, the plated bumps may be formed such that upper surfaces of the bumps are displaced above the passivation layer on the active surface of the wafer. The displaced height of the bump upper surface may be, for example, about 0.2 microns to about 0.5 microns above the passivation layer of the wafer. The upper surfaces of the plated bumps may alternatively be substantially coplanar with the upper surface of the passivation layer of the wafer.

In another aspect of the present invention, an individual semiconductor die singulated from the wafer may be assembled in a semiconductor device assembly. In particular, a semiconductor die having plated bumps thereon according to the present invention is attached to carrier substrate pads, terminals or leads. Bond wires may then be extended between and bonded to the carrier substrate and to the plated bumps on the active surface of the semiconductor die.

In one exemplary semiconductor device assembly, at least some of the plated bumps are formed proximate a periphery on the active surface of the semiconductor die. With this arrangement, the back surface of the semiconductor die is attached to the surface of the carrier substrate so that bond wires may be extended between the peripheral plated bumps and the conductive pads on the carrier substrate.

In another exemplary semiconductor device assembly, at least some of the plated bumps are centrally aligned on the active surface of the semiconductor die. The carrier substrate in this semiconductor device assembly includes a slot defined therein and extends between the surface having the conductive pads and an opposing, second surface. With this arrangement, the active surface of the semiconductor die is attached to the second surface of the carrier substrate so that the centrally aligned plated bumps of the semiconductor die are exposed through the slot in the carrier substrate. The bond wires extend through the slot of the carrier substrate from the centrally aligned plated bumps to the conductive pads on the surface of the carrier substrate. Of course, the carrier substrate may also comprise a lead frame, as known in the art.

In one aspect of the present invention, the plated bumps on the wafer may be prepared to optimize the pull strength of the bond wires subsequently bonded to the plated bumps. Such optimized pull strength may be accomplished by cleaning the plated bumps prior to bonding the bond wires thereto using an argon plasma cleaning process. Such cleaning process removes unwanted matter from the plated bumps, which strengthens the subsequently formed bonds between the plated bumps and the bond wires.

In another aspect, a semiconductor device assembly of the present invention is mounted to a circuit board in an electronic system, such as a computer system. In the electronic system, the circuit board is also electrically connected to a processor device which electrically communicates with an input device and an output device as well as the semiconductor device assembly of the present invention.

Other features and advantages of the present invention will become apparent to those of skill in the art through a consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, wherein:

DETAILED DESCRIPTION OF THE INVENTION

Figure 1:
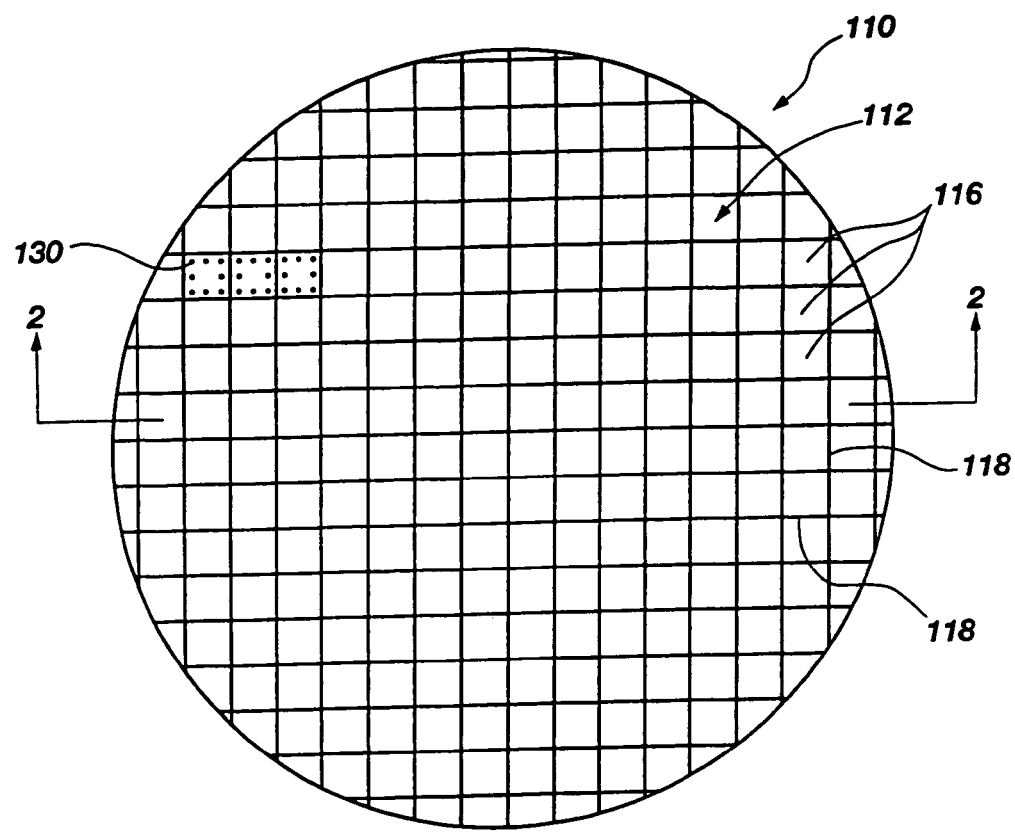
FIG. 1 illustrates a simplified top view of a wafer depicting the wafer including rows and columns of semiconductor dice according to the present invention.

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures retain the same or similar numerical designations.

Figure 2:
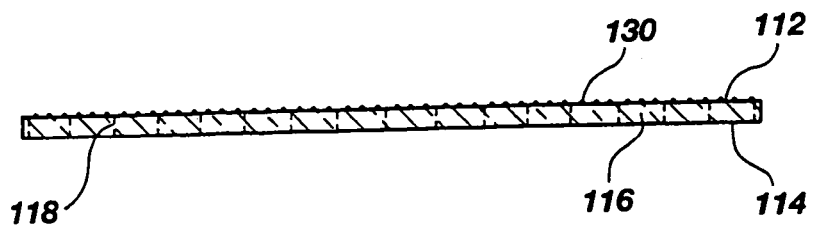
FIG. 2 illustrates a simplified cross-sectional side view of the wafer of FIG. 1 taken along section line 2—2, depicting the wafer having plated bumps on the semiconductor dice according to the present invention.

FIGS. 1 and 2 illustrate respective top and side views of a wafer 110 having plated bumps 130 formed thereon in accordance with the present invention. The wafer 110 is preferably formed from silicon, but may be formed from germanium, gallium arsenide, indium phosphide or any other known semiconducting material, the electrical conductivity and resistivity of which lie between those of a conductor and an insulator. As used herein, the term "wafer" contemplates and encompasses not only conventional wafers but also other bulk substrates including a layer of semiconductor material including silicon-on-insulator (SOI) substrates, silicon-on-glass (SOG) substrates, silicon-on-sapphire (SOS) substrates, etc.

Wafer 110 includes multiple, unsingulated semiconductor dice 116 in an array of columns and rows, each distinguished by intervening lines or "streets" 118. The wafer 110, and thus each of the multiple semiconductor dice 116, includes an active surface 112 and a back surface 114. According to the present invention, the active surface 112 of the wafer 110 includes plated bumps 130 formed thereon. The plated bumps 130 are sized and configured for wire bonding bond wires thereto, specifically by stitch bonding. Such a wire bonding process may be, and typically is, employed in a process subsequent to separating or "singulating" the wafer into multiple semiconductor dice (partial wafer) or individual, singulated semiconductor dice 116.

Figure 3:
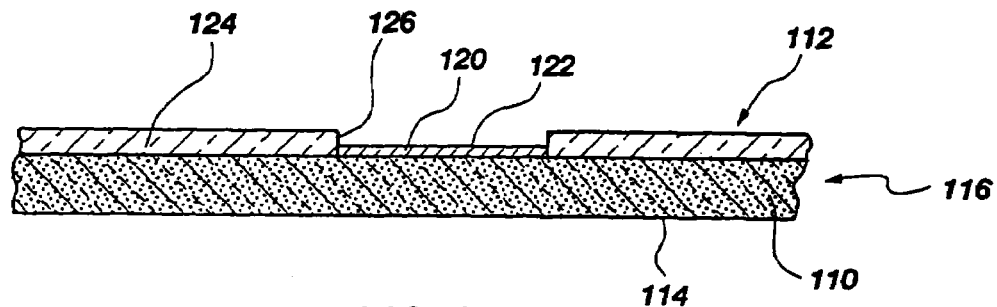
FIG. 3 illustrates a partial cross-sectional side view of the wafer of FIG. 1, depicting a bond pad in an active surface of one of the semiconductor dice in the wafer according to the present invention.
Figure 4:
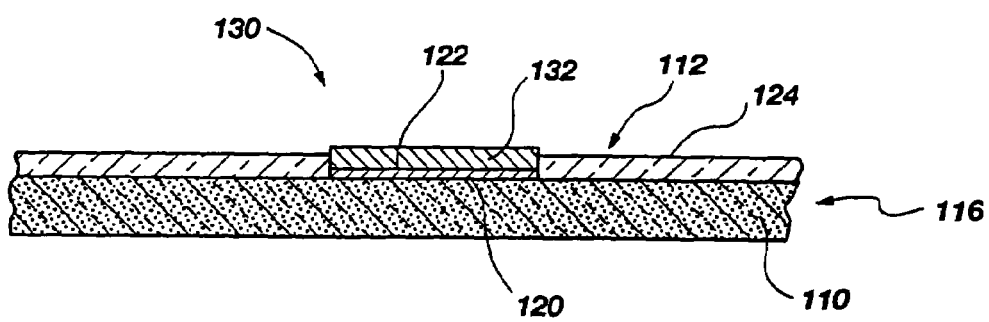
FIG. 4 illustrates a partial cross-sectional side view of the wafer of FIG. 1, depicting a nickel-containing plated bump formed on the bond pad, according to the present invention.
Figure 5:
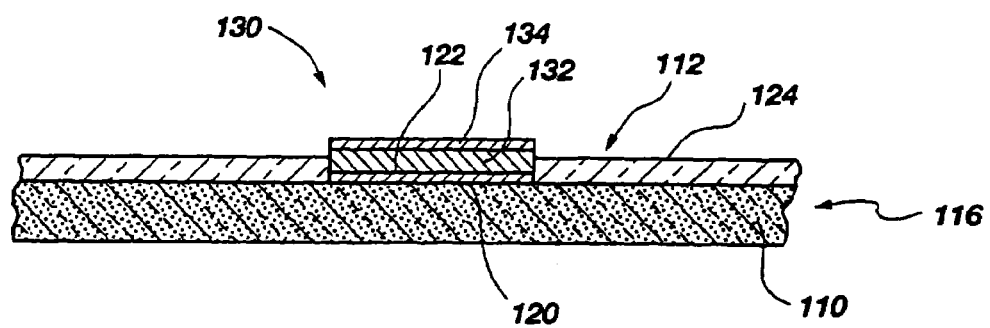
FIG. 5 illustrates a partial cross-sectional side view of a plated bump having a plated cap formed thereon, according to the present invention.

FIGS. 3–5 illustrate an exemplary method that may be used for forming the plated bumps 130 on the active surface 112 of the wafer 110. Referring first to FIG. 3, a simplified, enlarged partial cross-sectional view of the wafer 110 and a bond pad 120 of a semiconductor die 116 thereof is illustrated. The active surface 112 of the wafer 110 includes a passivation layer 124 with openings 126 defined therein, exposing bond pads 120. Each of the openings 126 in the passivation layer 124 may thus expose a bond pad 120 and, specifically, an exposed upper surface 122 thereof.

Bond pads 120 may be formed of any known electrically conductive material; however, bond pads 120 are typically formed of aluminum or an alloy thereof. The bond pads 120 interconnect to integrated circuitry (not shown) formed in the active surface 112 of wafer 110 on each of the respective semiconductor dice 116 fabricated on the wafer 110. The passivation layer 124 may comprise one or more layers of any known nonconductive dielectric-type material, such as silicon dioxide, BSG, PSG, BPSG or a ceramic. The passivation layer 124 electrically isolates adjacent bond pads 120 and the integrated circuitry in active surface 112 under the bond pads 120 to prevent short-circuiting and provides mechanical and environmental protection for the integrated circuitry.

FIG. 4 illustrates formation of a plated bump 130 on the exposed upper surface 122 of the bond pad 120. Plated bumps 130 may be substantially simultaneously formed on each of the bond pads 120 on the wafer 110 through an electroless plating process. The plated bump 130 includes a plated layer 132 formed from any known plated material. It is currently preferred that the plated layer 132 comprise nickel or an alloy thereof. The electroless plating process provides deposition of metal from a chemical solution, usually at elevated temperatures, without an electrical current flowing as present in an electrolytic plating process. One suitable chemical solution that may be used for forming the plated bumps 130 may comprise a sodium hypophosphite nickel solution, using about 2 to 12% nickel at about a 90° C. process (bath) temperature. However, any commercially available electroless or electrolytic plating bath will serve the purpose. The chemical solution is provided in a bath in which up to approximately fifty wafers, or more, may sit immersed in a single plating cycle. A plating cycle may last approximately fifteen to sixty minutes and produce a plated layer 132 of nickel of about 5 to no more than about 10 microns thickness. It is generally best not to exceed 10 microns thickness of nickel, as an aluminum bond pad 120 of, for example, 100 µm by 100 µm in X-Y dimensions (parallel to the plane of wafer 110) which is in direct contact with the plated layer 132 of nickel is also in direct contact with a glass passivation layer 124 which is, in turn, directly in contact with the silicon of wafer 110. The plated nickel, when annealed, contracts and places a shear force on the underlying silicon and cause a phenomenon termed "cratering," and restricting the thickness of plated layer 132 to less than 10 microns will avoid such damage. Suitable products for conducting the electroless plating process on the wafers 110 to form the plated bumps 130 thereon are offered commercially by Packaging Technology in Nauen, Germany and Shipley Ronal Electronic and Industrial Finishing Division of Rohm and Haas Company.

FIG. 5 illustrates forming a plated cap 134 over the plated layer 132. The plated cap 134 may be formed utilizing an electroless process as described above. The plated cap 134 may be formed of any known plated material, such as, for example, gold or palladium, so long as the plated cap provides a suitable material for bonding to the material of bond wires. Although palladium may be used, utilizing gold to form the plated cap 134 may be preferred since bond wires are typically gold wires, which would provide gold-to-gold bonding adhesion. In one example, a plated cap 134 of gold may be formed to about a 0.2 to 0.8 micron thickness over plated layer 132. A suitable electroless gold plating technology is available at least from Packaging Technology. Alternatively, a plated cap of gold may be formed by immersion plating to a lesser, self-limiting thickness of about 0.05 micron. Formation of plated cap 134 may be optionally implemented, is not believed by the inventors to be required for practice of the present invention and is not to be taken as a limitation thereof.

As noted above, plated bumps 130 (optionally capped) may be formed on the bond pads 120 of the wafer 110 through the electroless plating process or processes. The electroless plating process provides greatly increased throughput, wherein plated bumps 130 may be formed substantially simultaneously on up to at least fifty wafers in a single batch in the hour long time it takes to conventionally form gold stud bumps, individually and sequentially, on each of the bond pads of only two or three wafers. Further, an upper surface of the plated bumps 130 may be displaced above the passivation layer on the wafer surface to prevent contact by the wirebonder capillary and damage to the surrounding region of the passivation layer proximate the plated bump 130 when wire bonding thereto. Thus, the present invention provides plated bumps 130 configured to provide a bonding structure on each of the semiconductor dice in the wafer in a process which is less expensive and substantially faster than conventional stud bumping processes. As an alternative to the electroless plating process, the plated bumps 130 may be formed through an electrolytic plating process utilizing techniques well known in the art.

In another aspect of the present invention, it has been found to be advantageous to conduct a brief argon plasma cleaning process on the plated bumps 130 prior to wire bonding. Such plasma cleaning has been found to increase the pull strength of the wire bonds to the plated bumps 130. For example, after conducting an argon plasma cleaning operation of 120 seconds on plated bumps comprising a 5 micron electroless-plated nickel layer 132 with a 0.05 micron immersion-plated cap 134, bond wires bonded to the plated bumps 130 exhibited a robust pull strength of 10.5 grams. In comparison, without the plasma cleaning, the pull strength to similarly formulated and configured plated bumps 130 exhibited a far lesser pull strength of approximately 4.5 grams. In addition, after cleaning, nearly all of the bond wedge remains on the plated bump 130 and the wire break occurs at the expected location where the wire and heel of the bond connect, which is the weakest point of the wire. Further, a number of wire bonds effected after cleaning were so strong that the wire broke midspan during pull testing. Thus, an argon plasma cleaning process on the plated bumps 130 may be conducted to optimize the pull strength between the bond wires and the plated bumps 130. An oxygen plasma may also be used for cleaning the plated bumps 130.

Figure 6:
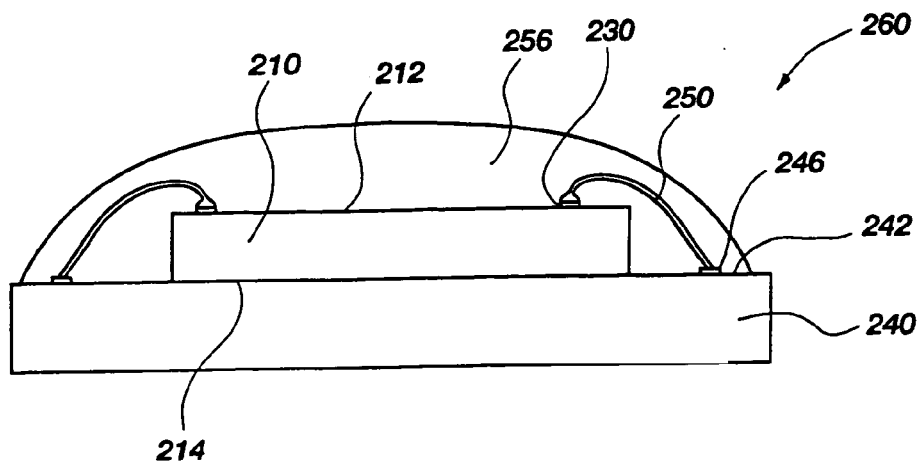
FIG. 6 illustrates a simplified side view of a semiconductor device assembly, depicting a semiconductor die back bonded to a carrier substrate with wire bonds extending therebetween according to the present invention.
Figure 7:
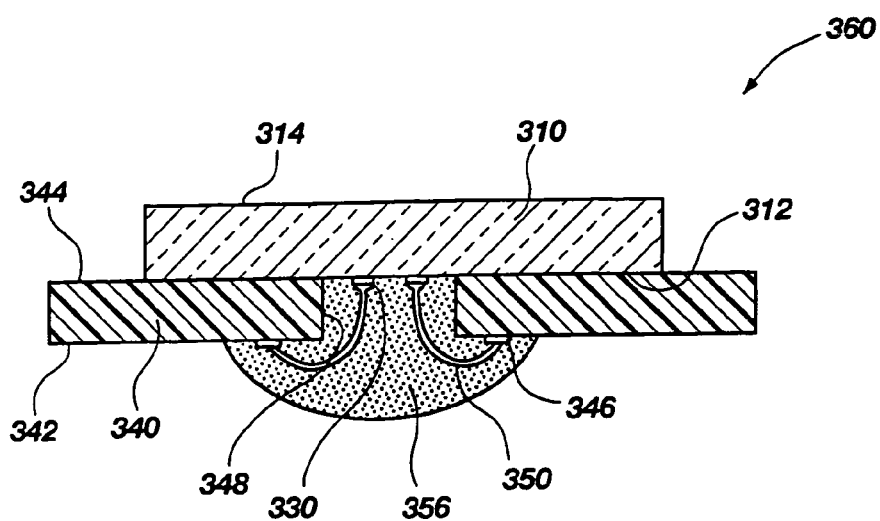
FIG. 7 illustrates a simplified cross-sectional side view of another semiconductor device assembly, depicting a semiconductor die front bonded to a carrier substrate with a slot with wire bonds extending through the slot and interconnected to both the semiconductor die and carrier substrate according to the present invention.

FIGS. 6 and 7 are illustrative examples of two respective semiconductor device assembly arrangements, wherein wire bonding techniques may be employed in conjunction with the present invention. Prior to wire bonding, the wafer 110 is diced or singulated into individual semiconductor dice 116. Such a singulation process may be accomplished by any known and suitable means for separating the semiconductor dice, such as by sawing or scribing the wafer along lines or streets 118 (see, FIG. 1) or by cutting along the lines with a laser. The singulated semiconductor dice 116 are then prepared for die attach, wherein a singulated semiconductor die may be attached to a carrier substrate such as an interposer, printed circuit board or lead frame preliminary to wire bonding.

Referring first to semiconductor device assembly 260 in FIG. 6, a semiconductor die 210 (which may, of course, comprise one of singulated semiconductor dice 116) having an active surface 212 and a back surface 214 is back bonded using, for example, an epoxy, silver solder or adhesive-coated tape segment to a first surface 242 of a carrier substrate 240. The carrier substrate 240 may include conductive pads 246 on the first surface 242 thereof. Carrier substrate 240 may be formed from any suitable type of substrate material known in the art, such as bismaleimide triazine (BT) resin, ceramics, FR-4 or FR-5 materials. With this arrangement, the exposed surfaces of peripherally located bond pads bearing plated bumps 230 according to the present invention on the active surface 212 of the semiconductor die 210 are oriented upwardly. The semiconductor device assembly 260 may then undergo a wire bonding process, wherein bond wires 250 are extended between the plated bumps 230 on the semiconductor die 210 and conductive pads 246 on the carrier substrate 240. After such a wire bonding process, the semiconductor device assembly 260 may be encapsulated as shown schematically with a dielectric encapsulation material 256 as known in the art and as previously mentioned to encapsulate the active elements of the semiconductor die 210, namely, the active surface 212, plated bumps 230 and bond wires 250.

FIG. 7 illustrates another semiconductor device assembly 360, wherein the semiconductor die 310 (which may, of course, comprise one of singulated semiconductor dice 116) is bonded with its active surface 312 toward to the carrier substrate 340. Bond pads bearing plated bumps 330 according to the present invention may be centrally aligned in one or more rows on the active surface 312 thereof. In this semiconductor device assembly 360, the carrier substrate 340 defines an opening in the form of slot 348 that extends from a first surface 342 to a second surface 344 of the carrier substrate 340 and is of sufficient width and length to expose the centrally aligned plated bumps 330 on the semiconductor die 310. With this arrangement, the semiconductor die 310 is bonded so that the plated bumps 330 are exposed through the slot 348 in the carrier substrate 340. Bond wires 350 may then be extended between the plated bumps 330 on the semiconductor die 310 and conductive pads 346 on the first surface 342 of the carrier substrate 340 through slot 348. The plated bumps 330, bond wires 350 and the exposed active surface 312 of the semiconductor die 310 may then be covered with a dielectric encapsulation material 356 as schematically shown for protection thereof, as known in the art. Similarly, the back side 314 of semiconductor die 310 may be encapsulated.

Figure 8:
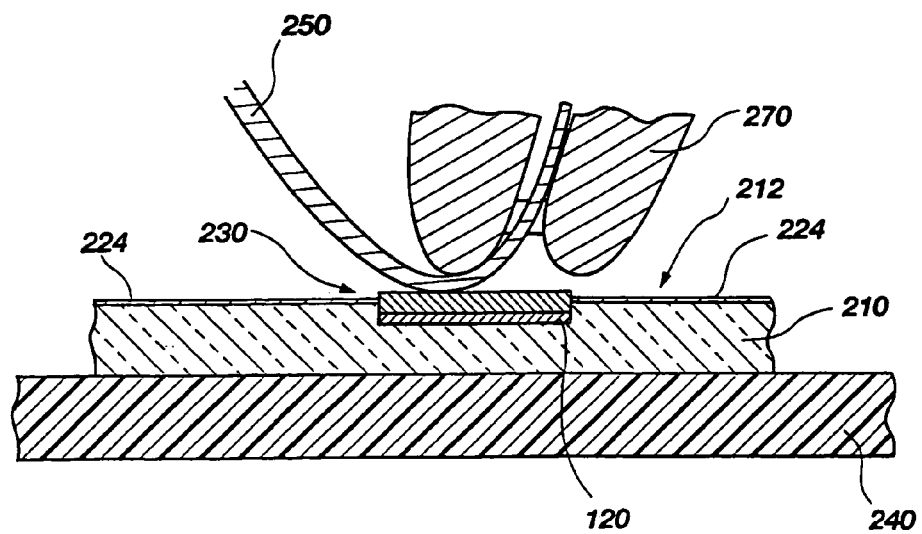
FIG. 8 illustrates a partial cross-sectional side view of a thermosonic capillary bonding bond wire to the plated bump according to the present invention.
Figure 9:
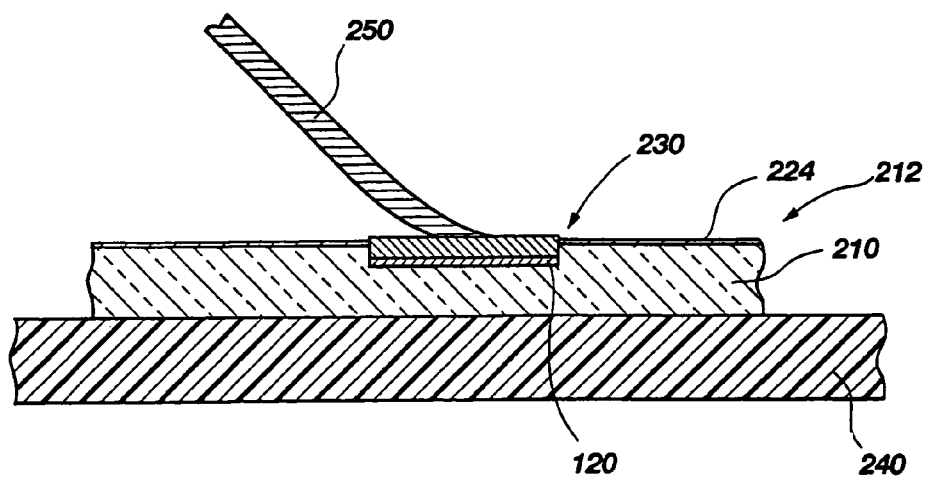
FIG. 9 illustrates a partial cross-sectional side view of a bond wire stitch bonded to the plated bump according to the present invention.

Turning to FIGS. 8 and 9, there is illustrated a thermosonic wire bonding process for stitch bonding to plated bumps 230 on a semiconductor die 210 in an exemplary semiconductor device assembly, such as semiconductor device assembly 260 as illustrated in FIG. 6. Referring first to FIG. 8, a bond wire 250 may extend through a wire bond capillary 270 to the plated bump 230 to stitch bond the bond wire 250 to the plated bump 230. The bond wire 250 may be of any conductive material suitable for a thermosonic wire bonding process, but is preferably gold. As the wire bond capillary 270 extends the bond wire 250 to the plated bump 230, the wire bond capillary 270 places a load on the bond wire 250 against the plated bump 230 transverse to the active surface 212 of semiconductor die 210 while simultaneously ultrasonically exciting the bond wire 250 and specifically the portion thereof in contact with plated bump 230. In response to the combination of load and ultrasonic power applied to the bond wire 250, the bond wire 250 and plated bump 230 join, after which the portion of bond wire 250 still carried by wire bond capillary 270 is broken away by pulling, leaving a wedge-shaped stitch bond, as shown in FIG. 9.

Since the plated bumps 230 are formed to be at least coplanar with the passivation layer 224 and desirably formed to extend to a height slightly above the surrounding passivation layer on active surface 212 of the semiconductor die 210, the relatively fragile, non-resilient passivation layer 224 surface area and integrated circuitry thereunder in the region surrounding the plated bumps 230 is substantially removed from contact by the capillary 270 in the stitch bonding process. The height that the plated bumps 230 extend above the passivation layer 224 disposed over active surface 212 of the semiconductor die 210 may be about 0.2 microns to about 2.5 microns, or any other suitable height to protect the active surface 212 of the semiconductor die 210. Obviously, the thickness of the nickel portion of the plated bumps 230 may be widely varied to accommodate different thicknesses of a passivation layer 224. For a 1 µm depth passivation layer, it is contemplated that a 5 µm, a 1.5 µm or even a 1.2 µm thick plated bump 230 may suffice to prevent contact of the wire bond capillary 270. It is contemplated that plated bump 230, after attaining a level with the exposed outer surface of passivation layer 224, may extend thereover as it increases in height, although this is not required or even necessarily desired, due to the widely differing coefficients of thermal expansion (CTE) of the two materials.

Figure 10:
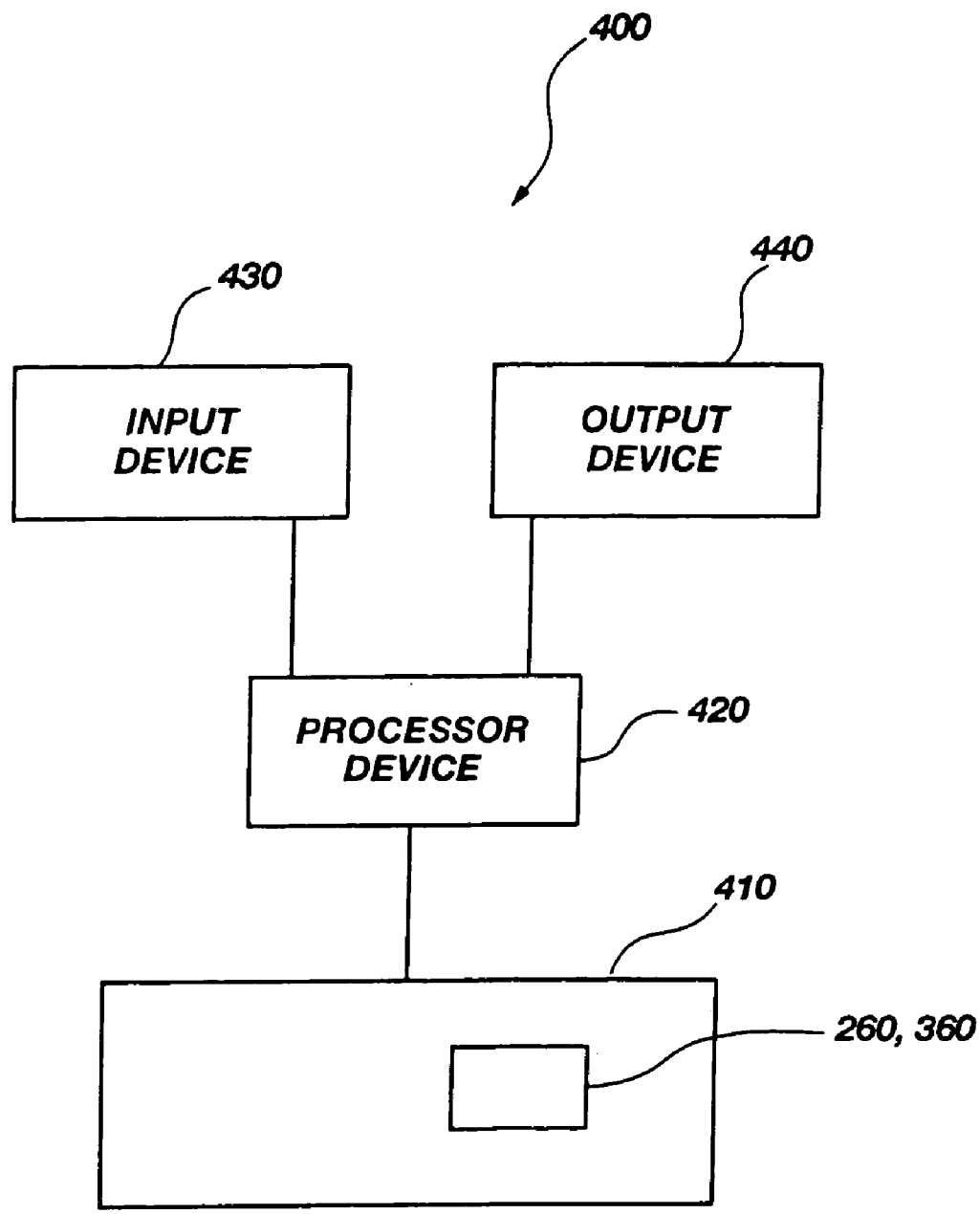
FIG. 10 illustrates a block diagram of the semiconductor device assembly of the present invention interconnected to an electronic system.

As illustrated in block diagram form in drawing FIG. 10, exemplary semiconductor device assemblies 260 or 360 with plated bumps and stitch bonds according to the present invention may be mounted to a circuit board 410 in an electronic system 400, such as a computer system. In the electronic system 400, the circuit board 410 may be connected to a processor device 420 which communicates with an input device 430 and an output device 440. The input device 430 may comprise a keyboard, mouse, joystick or any other type of electronic input device. The output device 440 may comprise a monitor, printer or storage device, such as a disk drive, or any other type of output device. The processor device 420 may be, but is not limited to, a microprocessor or a circuit card including hardware for processing instructions for the electronic system 400. Additional structure for the electronic system 400 is readily apparent to those of ordinary skill in the art.

While the present invention has been disclosed in terms of certain preferred embodiments and alternatives thereof, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of bumping wafers, comprising:
providing at least one wafer having an active surface and a back surface, the active surface having bond pads exposed thereon through a passivation layer having a first surface adjacent the active surface of the wafer and an opposing, outer surface;
disposing the at least one wafer in at least one bath including a nickel material to form a nickel-containing bump on an associated bond pad of the exposed bond pads, wherein each bump overlies an entire top surface of the associated bond pad, and includes a first bump surface positioned at a depth between the passivation layer first surface and the passivation layer opposing, outer surface and adjacent the top surface of the bond pad, and an opposing, outer surface of each bump is displaced above the outer surface of the passivation layer; and
plasma cleaning each nickel-containing bump.

2. The method of claim 1, wherein disposing comprises disposing the at least one wafer in at least one of an electroless bath and an electrolytic bath.

3. The method of claim 1, wherein disposing comprises disposing multiple wafers simultaneously in the at least one bath.

4. The method of claim 1, further comprising disposing the at least one wafer in at least another bath including a gold material to form a gold-containing cap over each of the nickel-containing bumps.

5. The method of claim 1, further comprising disposing the at least one wafer in at least another bath including a palladium material to form a palladium-containing cap over each of the nickel-containing bumps.

6. The method of claim 1, wherein forming comprises forming the nickel-containing bumps with the outer surface thereof displaced above the outer surface of the passivation layer approximately 0.2 microns to 2.5 microns.

7. A method of preparing wafers for bonding bond wires thereto, the method comprising:
providing at least one wafer having an active surface and a back surface, the active surface having bond pads exposed thereon through a passivation layer having a first surface adjacent the active surface of the wafer and an opposing, outer surface;
disposing the at least one wafer in at least one bath including a nickel material to form nickel-containing bumps on each of the exposed bond pads, wherein each bump overlies the entire top surface of an associated exposed bond pad, and each bump includes a first bump surface positioned at a depth between the passivation layer first surface and the passivation layer opposing, outer surface and adjacent the top surface of the associated exposed bond pad, and an opposing, outer surface of each bump is displaced above the outer surface of the passivation layer; and
plasma cleaning the nickel-containing bumps.

8. The method of claim 7, wherein plasma cleaning the nickel-containing bumps comprises oxygen plasma cleaning the nickel-containing bumps.

9. The method of claim 7, wherein plasma cleaning comprises performing an argon plasma cleaning.

10. The method of claim 7, wherein disposing comprises disposing the at least one wafer in at least one of an electroless bath and an electrolytic bath.

11. The method of claim 10, wherein disposing comprises disposing a plurality of wafers simultaneously.

12. The method of claim 7, further comprising disposing the at least one wafer in at least another bath including a gold material to form a gold-containing cap over each of the nickel-containing bumps.

13. The method of claim 7, further comprising disposing the at least one wafer in at least another bath including a palladium material to form a palladium-containing cap over each of the nickel-containing bumps.

14. The method of claim 7, wherein disposing comprises forming the nickel-containing bumps with an outer surface thereof displaced above an outer surface of the passivation layer approximately 0.2 microns to 2.5 microns.

15. The method of claim 1, wherein plasma cleaning each nickel-containing bump comprises argon plasma cleaning each nickel-containing bump.

16. The method of claim 1, wherein plasma cleaning each nickel-containing bump comprises oxygen plasma cleaning each nickel-containing bump.

* * * * *